United States Patent
Sato

[11] Patent Number: 6,078,602
[45] Date of Patent: Jun. 20, 2000

[54] SEPARATE CONFINEMENT HETEROSTRUCTURED SEMICONDUCTOR LASER DEVICE HAVING HIGH SPEED CHARACTERISTICS

[75] Inventor: Kenji Sato, Tokyo, Japan

[73] Assignee: NEC Corporation, Tokyo, Japan

[21] Appl. No.: 08/982,945

[22] Filed: Dec. 2, 1997

[30] Foreign Application Priority Data

Feb. 12, 1996 [JP] Japan .................................. 8-321640

[51] Int. Cl.⁷ .............................. H01S 3/085; H01S 3/19
[52] U.S. Cl. .............................................................. 372/45
[58] Field of Search ........................................ 372/45, 46

[56] References Cited

U.S. PATENT DOCUMENTS

| | | | |
|---|---|---|---|
| 5,040,186 | 8/1991 | Logan et al. | 372/45 |
| 5,619,519 | 4/1997 | Hamada et al. | 372/46 |

FOREIGN PATENT DOCUMENTS

| | | |
|---|---|---|
| 60-145687 | 8/1985 | Japan . |
| 61-258487 | 11/1986 | Japan . |
| 62-249496 | 10/1987 | Japan . |
| 63-200585 | 8/1988 | Japan . |
| 1-181492 | 7/1989 | Japan . |
| 2-45991 | 2/1990 | Japan . |
| 2-228088 | 9/1990 | Japan . |
| 4-33386 | 2/1992 | Japan . |
| 4-280693 | 10/1992 | Japan . |
| 4-320082 | 11/1992 | Japan . |
| 5-243669 | 9/1993 | Japan . |
| 5-251813 | 9/1993 | Japan . |
| 6-45697 | 2/1994 | Japan . |
| 2-268320 | 9/1994 | Japan . |
| 6-252512 | 9/1994 | Japan . |
| 6-342959 | 12/1994 | Japan . |
| 6-350193 | 12/1994 | Japan . |
| 7-135370 | 5/1995 | Japan . |
| 9-148682 | 6/1997 | Japan . |

Primary Examiner—James W. Davie
Attorney, Agent, or Firm—Hutchins, Wheeler & Dittmar

[57] ABSTRACT

In a semiconductor laser device including a multiple quantum well active layer formed by well layers and barrier layers alternately, and an n-type separate confinement heterostructured layer and a p-type separate confinement heterostructural layer sandwiching the multiple quantum well active layer, the n-type separated confinement heterostructured layer is thicker than the p-type separated confinement heterostructured layer.

13 Claims, 16 Drawing Sheets

6,078,602

SEPARATE CONFINEMENT HETEROSTRUCTURED SEMICONDUCTOR LASER DEVICE HAVING HIGH SPEED CHARACTERISTICS

BACKGROUND OF THE INVENTION

1. Field of the Invention

The present invention relates to a semiconductor laser device including a multiple quantum well (MQW) active layer used in optical communication systems.

2. Description of the Related Art

Generally, a separate confinement heteroastructure (SCH) has been adopted, so as to confine electron-hole pairs and photons into well layers of an MQW active layer, thus improving the conversion efficiency. In addition, a graded index waveguide (GRIN)-SCH type III–IV group compound semiconductor laser device has been developed (see JP-A-61-258487, JP-A-6-45697 & JP-A-1-181492).

A prior art GRIN-SCH type semiconductor laser device includes an MQW active layer, and an n-type GRIN-SCH layer and a p-type GRIN-SCH layer sandwiching the MQW active layer. In this case, the energy gaps of the GRIN-SCH layers are larger than that of the barrier layers of the MQW active layer, which also causes linearly or curvilinearly graded infractive indexes in the GRIN-SCH layers. Thus, the linearly or curvilinearly energy gaps effectively confine electrons and holes in the MQW active layer, while the linearly or curvilinearly refractive indexes effectively confine photons in the MQW active layer. As a result, a conversion efficiency depending upon the interaction between electron-hole pairs and photons is enhanced, which improves the static characteristics of the semiconductor laser device. This will be explained later in detail.

The prior art semiconductor laser device, however, does not optimize the dynamic characteristics such as modulation operation characteristics, and as a result, it is impossible to obtain good modulation characteristics at high speed (high frequencies). In addition, since electrons and photons are confined in the narrow well layers of the MQW active layer, when the density of electrons therein is increased, free electrons are absorbed by the plasma effect of electrons, thus deteriorating the laser characteristics.

SUMMARY OF THE INVENTION

It is an object of the present invention to provide a semiconductor laser device capable of improving the modulation width and the temperature characteristics.

According to the present invention, in a semiconductor laser device including an MQW active layer formed by well layers and barrier layers alternately, and an n-type SCH layer and a p-type SCH layer sandwiching the MQW active layer, the n-type SCH layer is thicker than the p-type SCH layer. Thus, the running time of holes through the p-type SCH layer is reduced as compared with the running time of electrons through the n-type SCH layer.

In addition, the n-type SCH layer is of a GRIN type, thus reducing the capture time of electrons into the MQW active layer.

The reduced running time of holes and the reduced capture time of electrons enhance the injection efficiency of carriers into the MQW active layer.

Also, since the p-type SCH layer is not of a GRIN type, the second energy levels of electrons and holes are both reduced, which reduces the capture time of electrons into the MQW active layer by about 10000 times. Further, since the running time of holes through the p-type SCH layer is reduced, the capture time of holes into the MQW active layer is reduced by about 1.5 times.

In addition, a tunnel barrier layer capable of passing electrons therethrough is provided in the n-type SCH layer, which further reduces the capture time of electrons into the MQW active layer.

The enhanced injection efficiency of electrons and holes into the MQW active layer suppresses the overflowing of electrons and holes from the MQW active layer, thus improving the temperature characteristics.

The asymmetric structure of the n-type SCH layer and the p-type SCH layer makes the optical distribution in the MQW active layer asymmetrical, thus reducing the absorption of free carriers therein. As a result, the laser characteristics are not deteriorated. Further, in a high speed operation, since electrons and holes are injected in balance into the MQW active layer, excellent modulation characteristics are obtained.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art GRIN-SCH type semiconductor laser device will be explained with reference to FIGS. 1, 2, 3 and 4.

Figure 1:
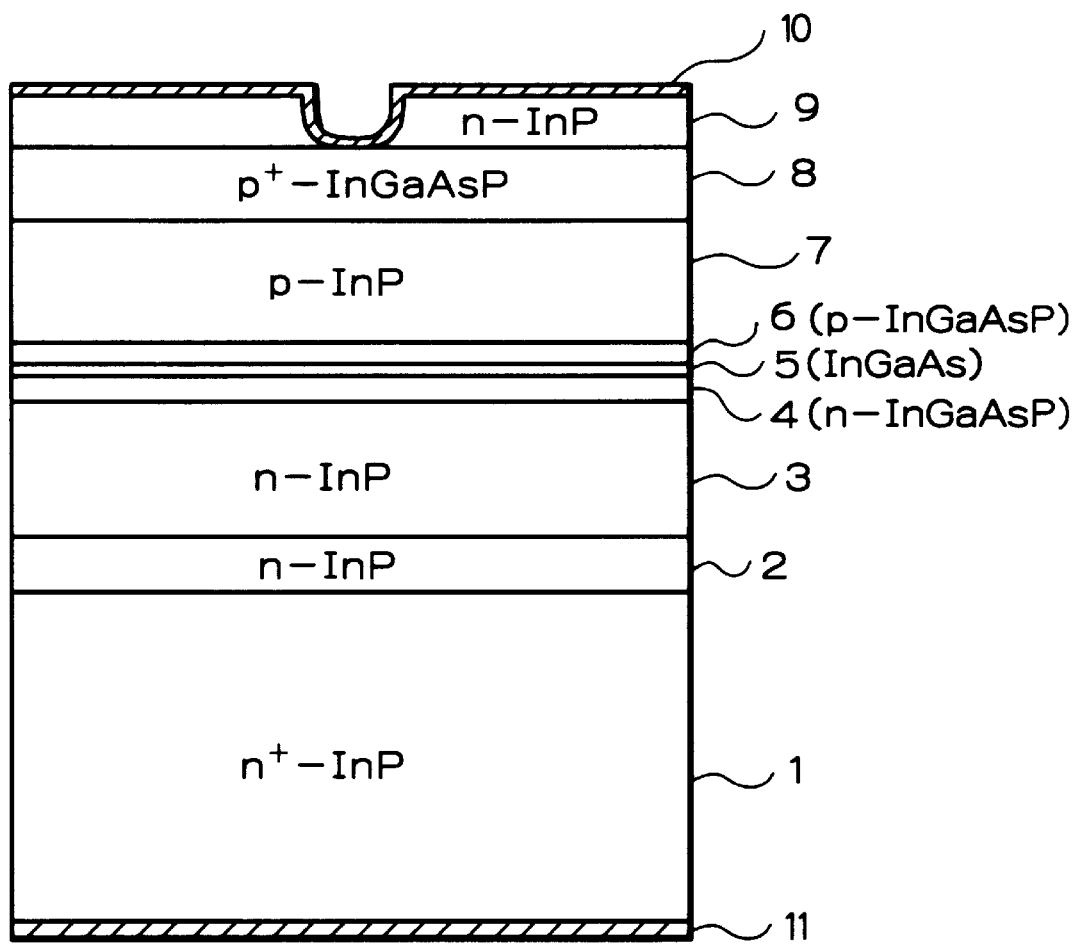
FIG. 1 is a cross-sectional view illustrating a prior art GRIN-SCH type semiconductor laser device.

In FIG. 1, which is a cross-sectional view illustrating a first prior art GRIN-SCH type semiconductor laser device, reference numeral 1 designates an n⁺-type InP substrate. Also, an n-type InP clad layer 3, an n-type InGaAsP GRIN-SCH layer 4, an InGaAs distortion MQW active layer 5, a p-type InP clad layer 7, a p⁺-type InGaAsP cap layer 8, an n-type InP current blocking layer 9 are sequentially grown on the InP substrate 1 by a molecular beam epitaxy (MBE) process, a metalorganic chemical vapor deposition (MOCVD) or a vapor phase epitaxy (VPE) process. Then, a P-type electrode 10 and an N-type electrode 11 are formed on the front and back surfaces, respectively.

Figure 2:
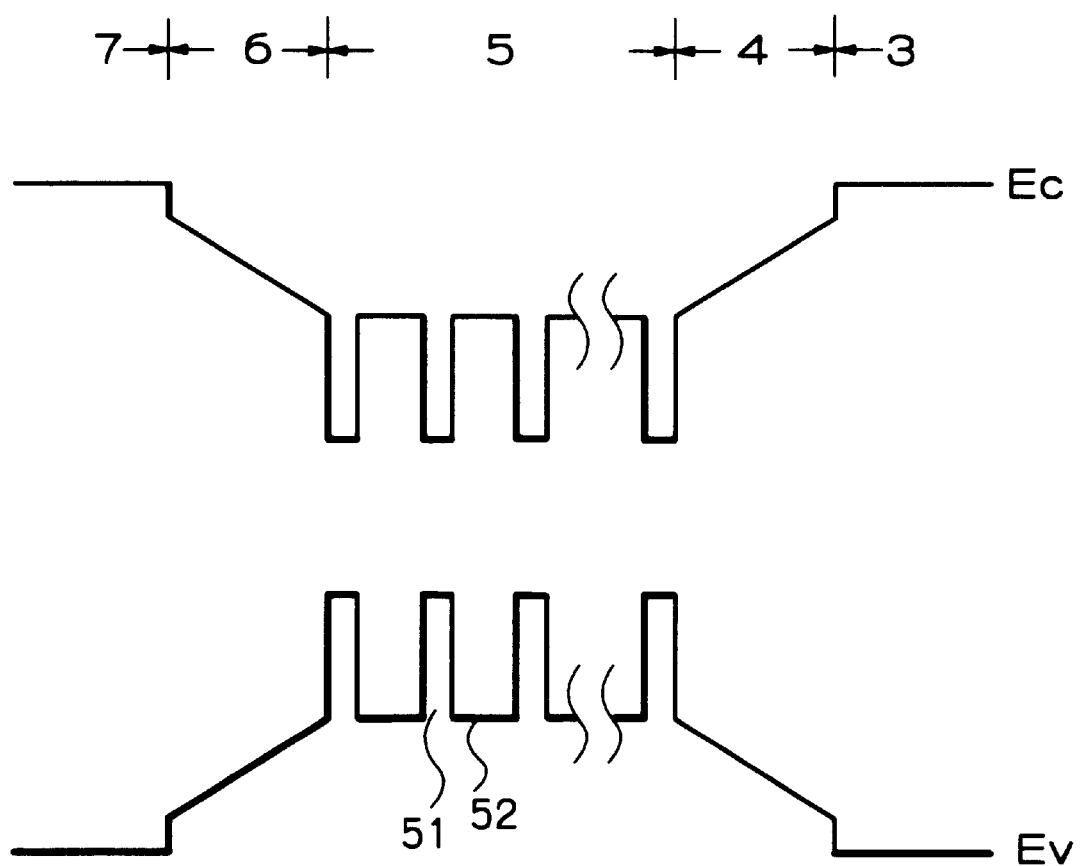
FIGS. 2 and 3 are energy gap diagrams of the MQW active layer and its neighborhood of FIG. 1.

In FIG. 2, which shows an energy band diagram of the distortion MQW active layer 5 and its neighborhood of FIG. 1, the distortion MQW active layer 5 consists of InGaAs well layers 51 and InGaAs barrier layers 52 laminated alternately. As shown in FIG. 2, the energy gaps or the GRIN-SCH layers 4 and 6 are linearly larger, as they become more remote from the distortion MQW active layer 5. The linearly graded energy gaps are caused by linearly graded compositions of the GRIN-SCH layers 4 and 6, which also causes linearly graded infractive indexes in the GRIN-SCH layers 4 and 6 (see JP-A-61-258487 & JP-A-6-45697).

Figure 3:
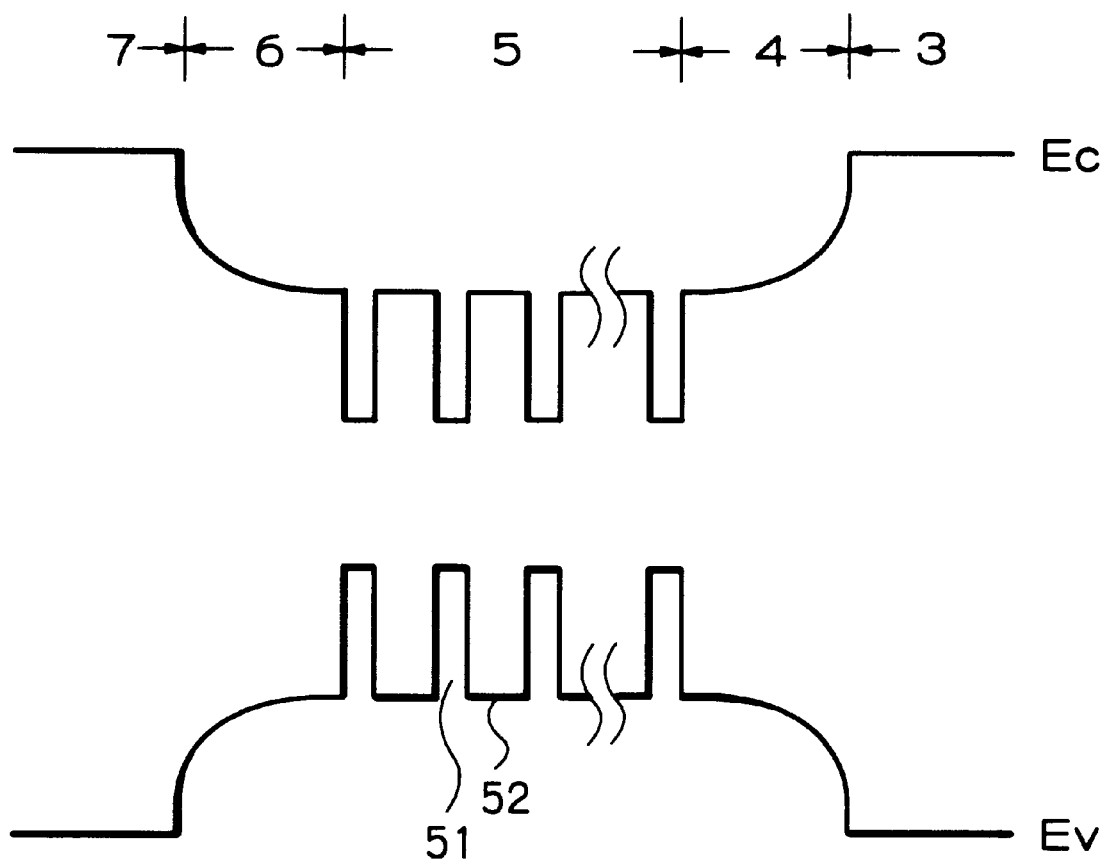

In FIG. 3, which illustrates a modification of the energy gap bands of FIG. 2, the energy gaps of the GRIN-SCH layers 4 and 6 are curvilinearly larger, as they become more remote from the MQW active layer 5. Also, the curvilinearly graded energy gaps are caused by curvilinearly graded compositions of the GRIN-SCH layers 4 and 6, which also causes curvilinearly graded infractive indexes in the GRIN-SCH layers 4 and 6 (see: JP-A-1-181492).

In FIGS. 2 and 3, note that $E_c$ is an electron energy at a conduction band edge, and $E_v$ is an electron energy at a valence band edge.

In the prior art GRIN-SCH type semiconductor laser device of FIG. 1, the linearly or curvilinearly graded energy gaps effectively confine electrons and holes in the MQW active layer 5, while the linearly or curvilinearly refractive indexes effectively confine photons in the MQW active layer 5. Thus, a conversion efficiency depending upon the interaction between electron-hole pairs and photons is enhanced, which improves the static characteristics of the semiconductor laser device of FIG. 1.

Figure 4:
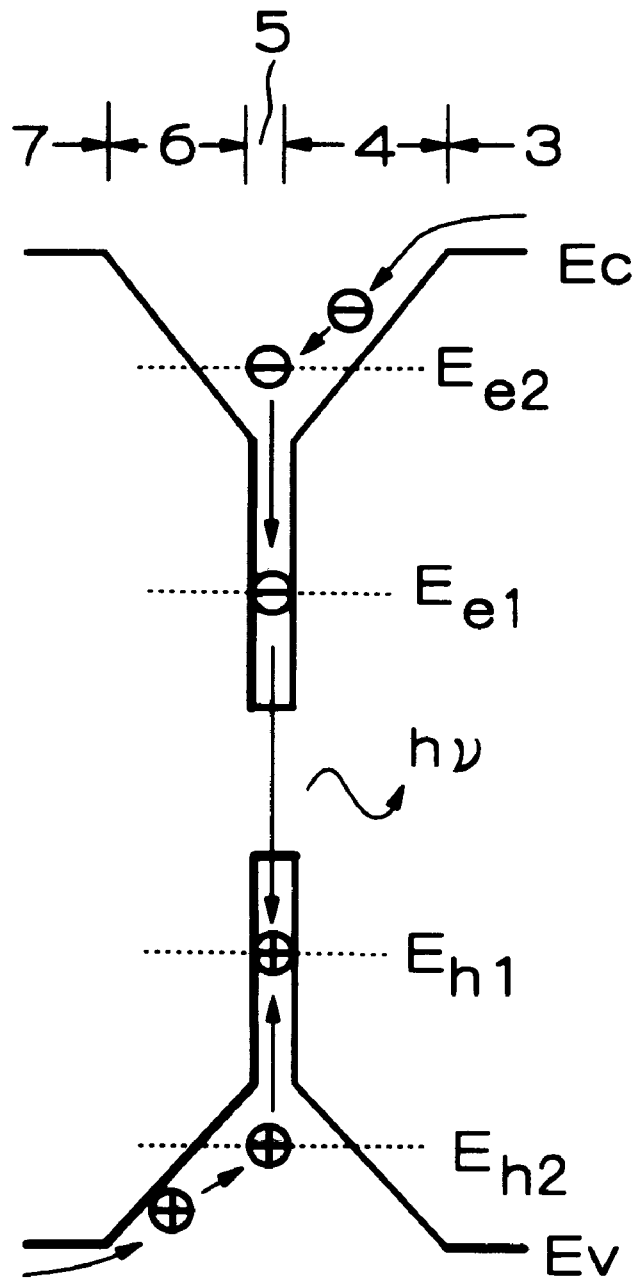
FIG. 4 is an energy band diagram for explaining the running speed of electrons and holes in the GRIN-SCH layers of FIG. 1.

The semiconductor laser device of FIG. 1, however, does not optimize the dynamic characteristics such as modulation operation characteristics. Note that the modulation bandwidth of the semiconductor laser device is dependent upon the balance between the injection efficiency of electrons into the MQW active layer 5 and the injection efficency of holes into the MQW active layer 5. That is, as shown in FIG. 4, a time of electrons running through the GRIN-SCH layer 4 to the MQW active layer 5 is remarkably smaller than a time of holes running through the GRIN-SCH layer 6 to the MQW active layer 5. For example, the former time is about. 40 picoseconds and the latter time is about 400 picoseconds, that is, the latter time is about ten times the former time. In addition, the capture time of electrons by the well layers of the MQW active layer 5 is several picoseconds, while the capture time of holes by the well layers of the MQW active layer 5 is about one-tenth of the capture time of electrons by the MQW active layer 5. Therefore, the injection efficiency of electrons into the MQW active layer 5 is remarkably different from the injection efficiency of holes into the MQW active layer 5, As a result, it is impossible to obtain good modulation characteristics at high speed (high frequencies).

In FIG. 4, note that $E_{e^1}$ and $E_{e^2}$ are first and second energy levels, respectively, of electrons within the well layers of the MQW active layer 5, and $E_{h^1}$ and $E_{h^2}$ are first and second energy levels, respectively, of holes within the well layers of the MQW active layer 5.

In addition, in the semiconductor laser device of FIG. 1, since electrons and photons are confined in the narrow well layers of the MQW active layer 5, when the density of electrons therein is increased, free electrons are absorbed by the plasma effect of electrons, thus deteriorating the laser characteristics.

Figure 5:
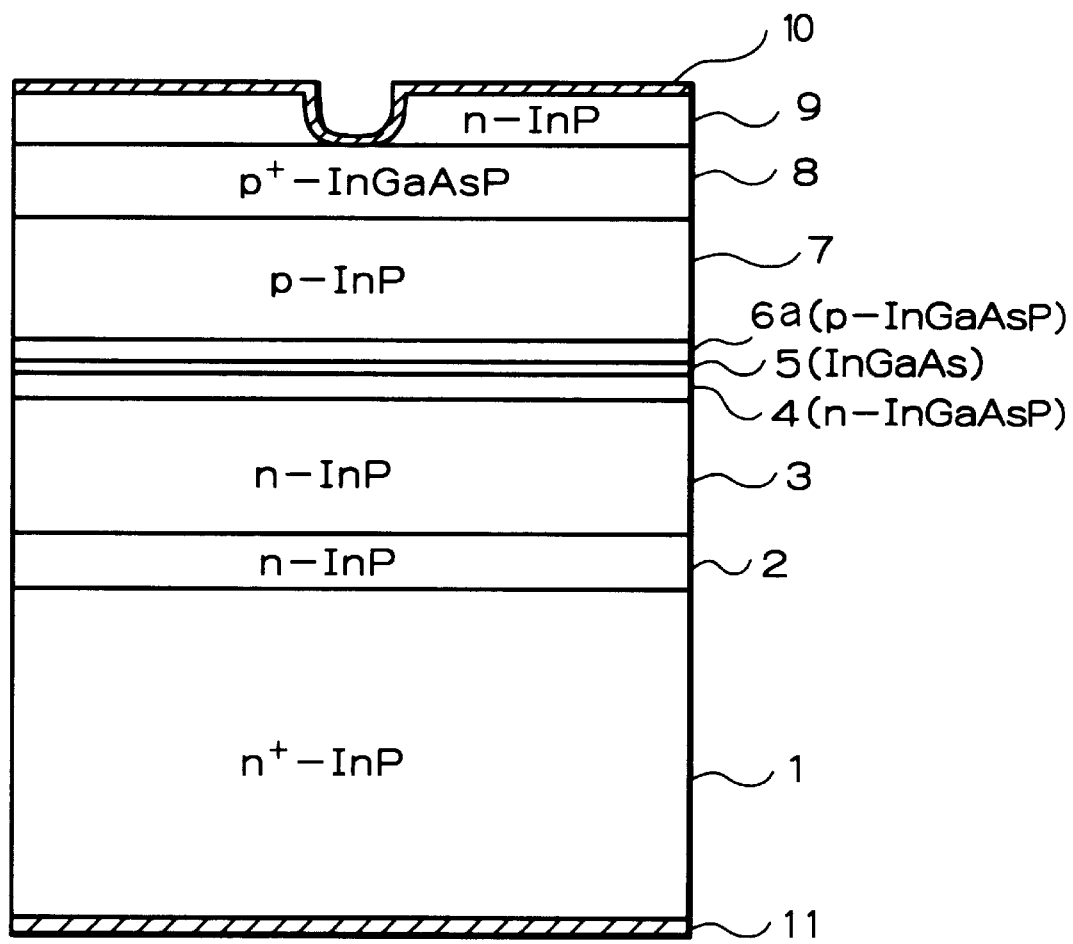
FIG. 5 is a cross-sectional view illustrating a first embodiment of the semiconductor laser device according to the present invention.

In FIG. 5, which illustrates a first embodiment of the present invention, a p-type InGaAsP SCH layer 6a is provided instead of the p-type InGaAsP GRIN-SCH layer 6 of FIG. 1.

Figure 6:
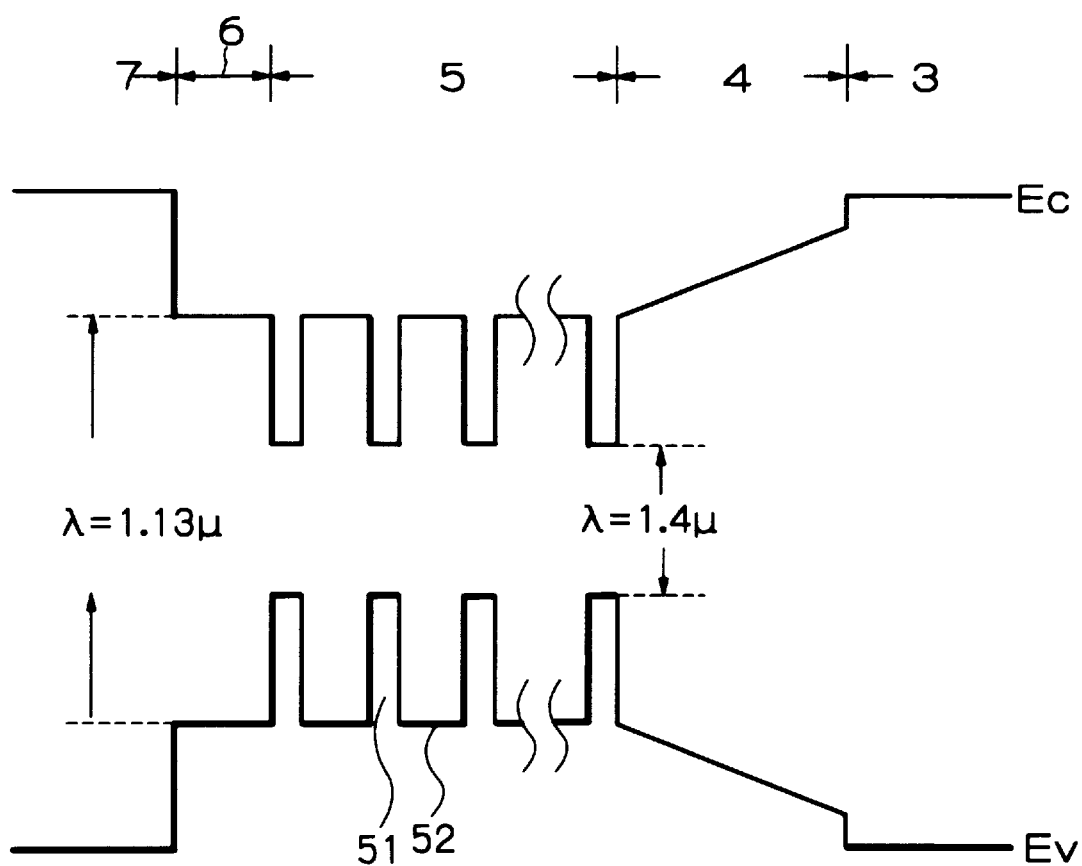
FIGS. 6 and 7 are energy gap diagrams of the MQW active layer and its neighborhood of FIG. 5.

In FIG. 6, which shows an energy band diagram of the distortion MQW active layer 5 and its neighborhood of FIG. 5, the energy gap of the SCH layer 6a and the energy gap of the GRIN-SCH layer 4 are both larger than the energy gap of the barrier layers 52 of the distortion MQW active layer 5. Also, the GRIN-SCH layer 4 is thicker than the SCH layer 6a.

In more detail, the distortion MQW active layer 5 consists of seven 5 nm thick InGaAsP well layers 51 having a 0.7 percent distortion and six 7 nm thick InGaAsP barrier layers 52. The energy gap of the well layers 51 corresponds to a wavelength of 1.4 µm, and the energy gap of the barrier layers 52 corresponds to a wavelength of 1.13 µm. The photons emitted from the distortion MQW active layer 5 correspond to a wavelength of 1.3 µm.

The GRIN-SCH layer 4 has an energy gap which is linearly larger, as it becomes more remote from the distortion MQW active layer 5, and has a thickness of 40 to 60 nm.

Figure 7:
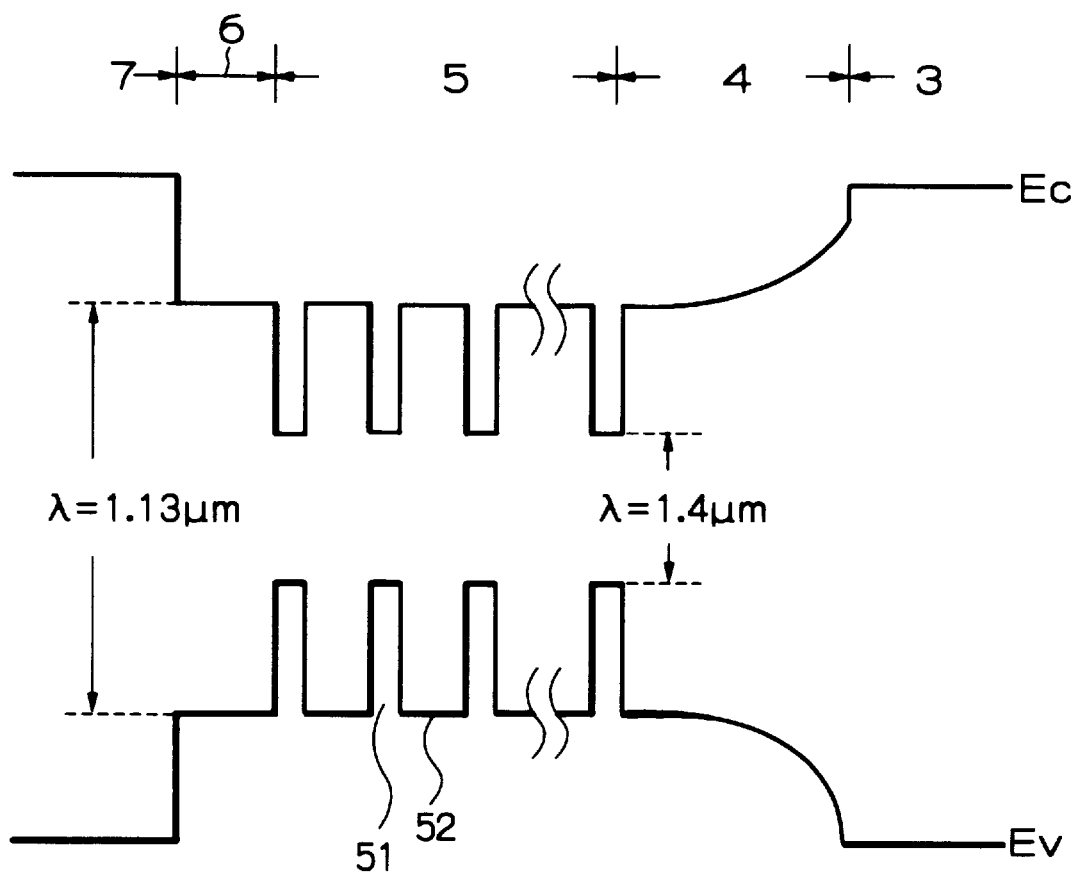

Note that the energy gap of the GRIN-SCH layer 4 of FIG. 6 can be curvilinear as shown in FIG. 7.

On the other hand, the SCH layer 6a has the same energy gap as the barrier layers 52 of the distortion MQW active layer 5.

Figure 8:
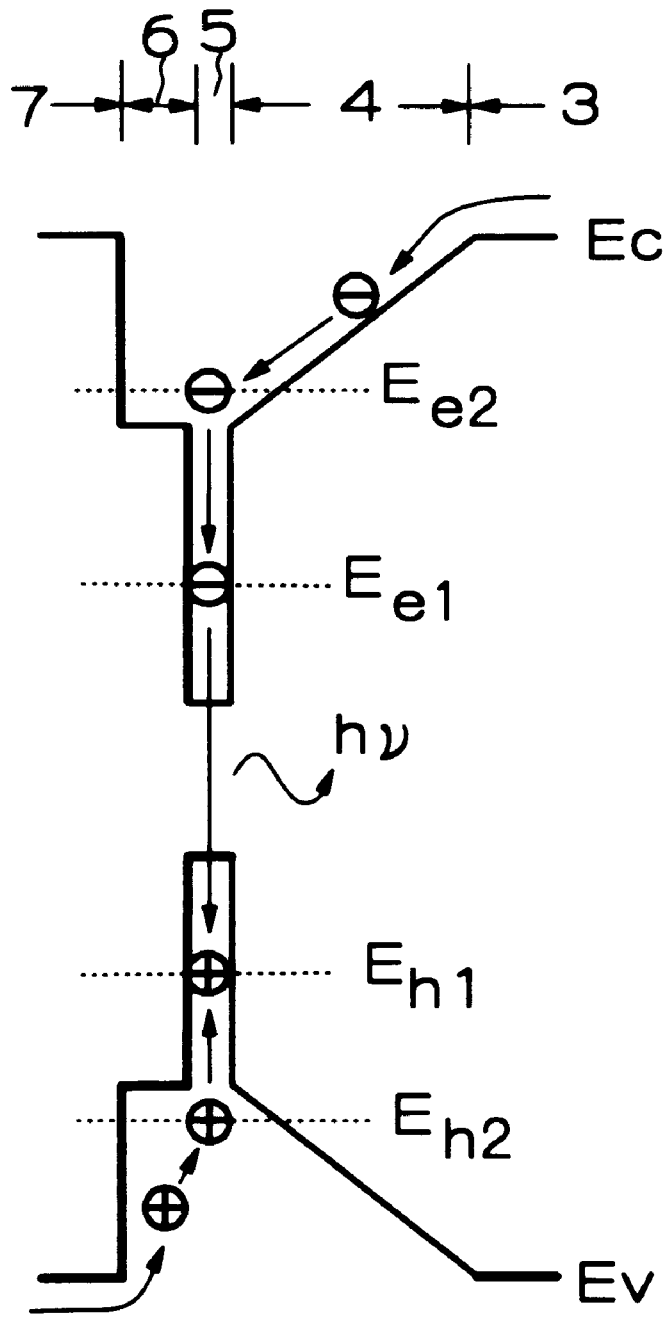
FIG. 8 is an energy band diagram for explaining the running speed of electrons and holes in the GRIN-SCH layer and the SCH layer of FIG. 5.

Thus, in the semiconductor laser device of FIG. 5, as shown in FIG. 8, a time of electrons running through the GRIN-SCH layer 4 to the MQW active layer 5 is brought close to a time of holes running through the SCH layer 6a to the MQW active layer 5. Therefore, the injection efficiency of electrons into the MQW layer 5 is brought close to the injection efficiency of holes into the MQW active layer 5, As a result, it is possible to obtain good modulation characteristics at high speed (high frequencies).

According to the inventor's experiment, when the semiconductor laser device of FIG. 5 is constructed as a resonator whose length is 300 µm, a front surface is 30-percent-coated, and a back surface is 90-percent-coated, the cut-off frequency at an output power of 10 mW is 10 GHz at a temperature of 20° C. and 8 GHz at a temperature of 85° C. Contrary to this, in the prior art GRIN-SCH type semiconductor laser device of FIG. 1, the cut-off frequency at an output power 10 mW is 9.5 GHz at a temperature of 20° C. and 6 GHz at a temperature of 85° C.

Figure 9:
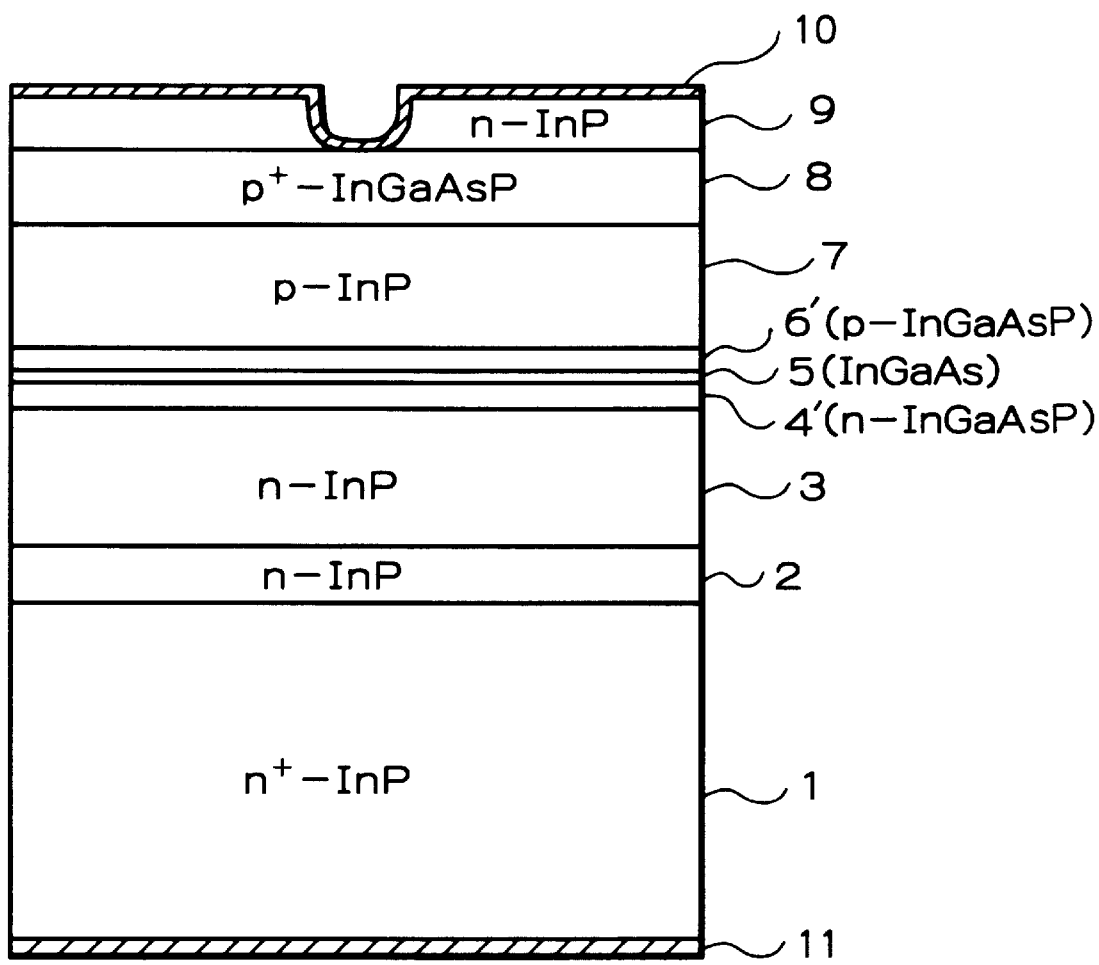
FIG. 9 is a cross-sectional view illustrating a second embodiment of the semiconductor laser device according to the present invention.

In FIG. 9, which illustrates a second embodiment of the present invention, the InGaAsP GRIN-SCH layers 4 and 6 of FIG. 1 are modified to an n-type InGaAs GRIN-SCH layer 4' and a p-type InAsP GRIN-SCH layer 6', respectively.

Figure 10:
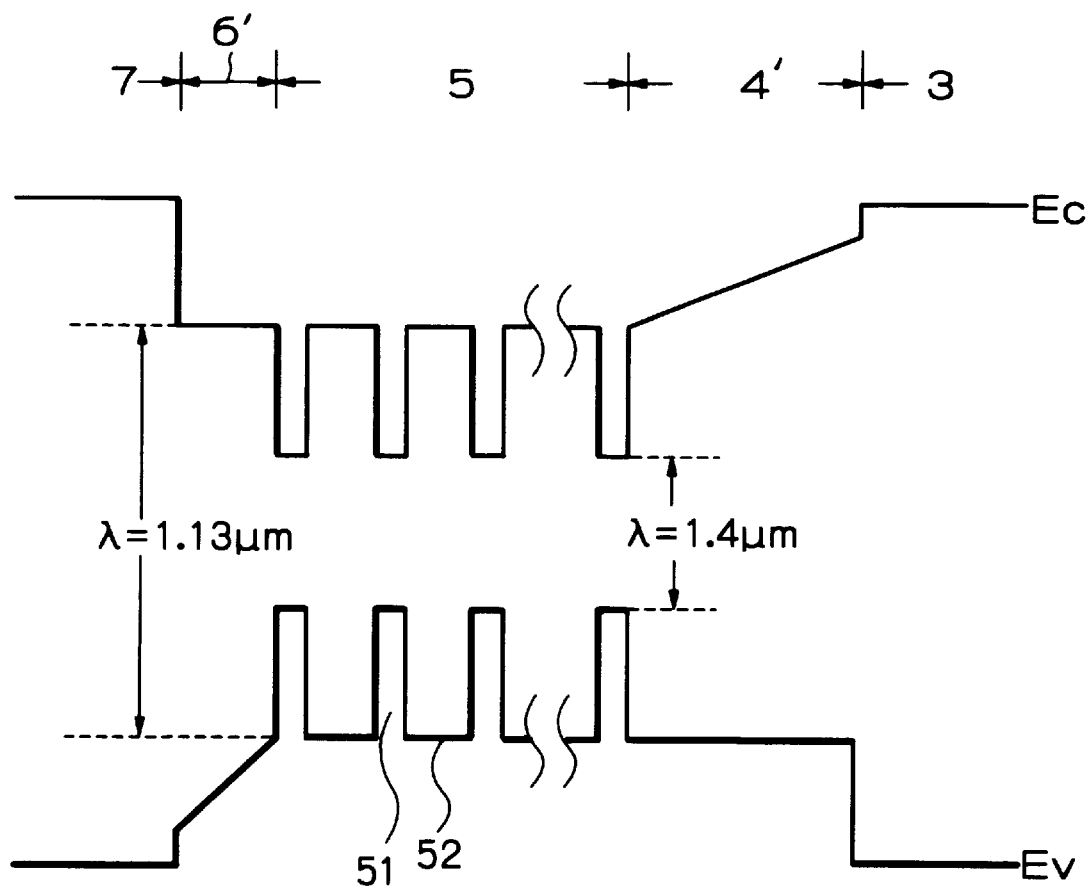
FIGS. 10 and 11 are energy gap diagrams of the MQW active layer and its neighborhood of FIG. 9.

In FIG. 10, which shows an energy band diagram of the distortion MQW active layer 5 and its neighborhood of FIG. 9, the energy gaps of the GRIN-SCH layers 4' and 6' are both larger than the energy gap of the barrier layers 52 of the distortion MQW active layer 5. Also, the GRIN-SCH layer 4' is thicker than the GRIN-SCH layer 6'.

The GRIN-SCH layer 4' has an energy gap which is linearly larger, as it becomes more remote from the distortion MQW active layer 5, and has a thickness of 40 nm. In this case, the composition of the III group materials of the GRIN-SCH layer 4' is gradually changed from InAlAs to InGaAsP at the interface between the layers 3 and 4', so that the conduction energy edge $E_c$ is changed while the valence energy edge $E_v$ is constant.

Figure 11:
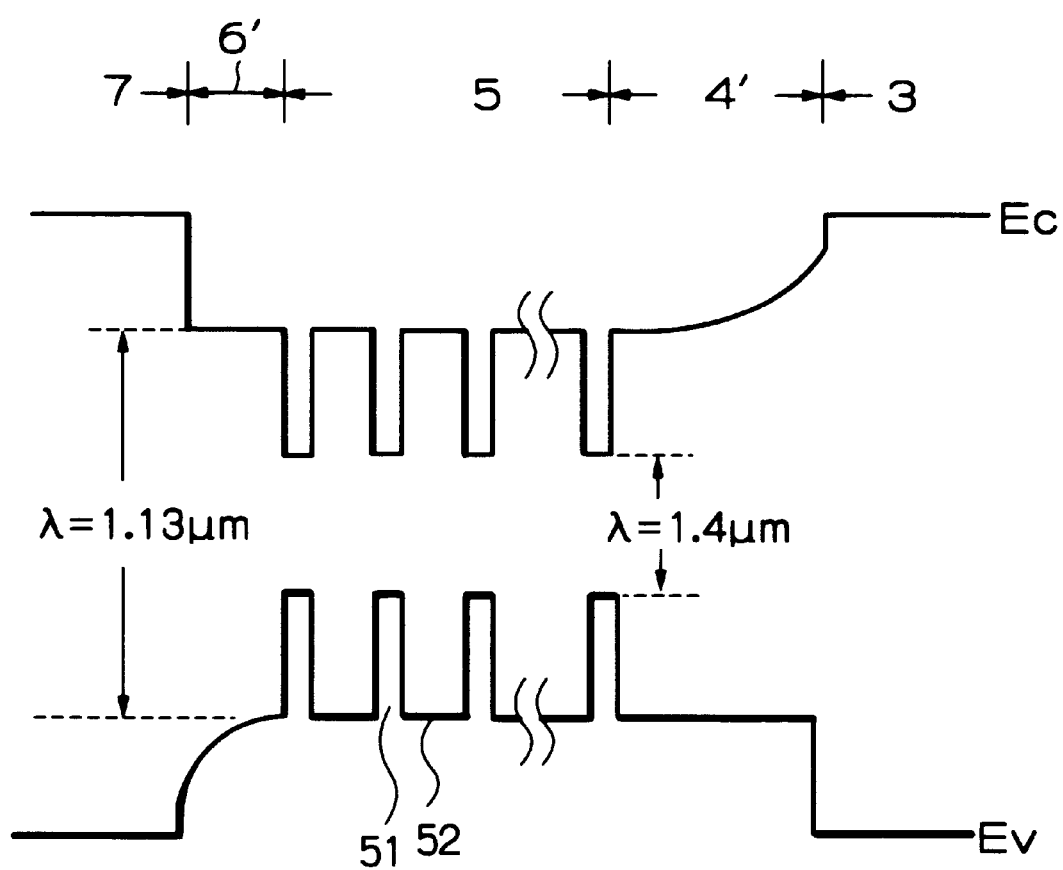

Note that the conduction energy edge $E_c$ of the GRIN-SCH layer 4 of FIG. 10 can be curvilinear as shown in FIG. 11.

On the other hand, the GRIN-SCH layer 6' has an energy gap which is linearly larger, as it becomes more remote from the distortion MQW active layer 5, and has a thickness of 20 nm. In this case, the In this case, the composition of the V group materials of the GRIN-SCH layer 6' is gradually changed to InAsP at the interface between the layers 6' and 7', so that the valence energy edge $E_v$ is changed while the conduction energy edge $E_c$ is constant.

Note that the valence energy edge $E_v$ of the GRIN-SCH layer 6' of FIG. 10 also can be curvilinear as shown in FIG. 11.

Figure 12:
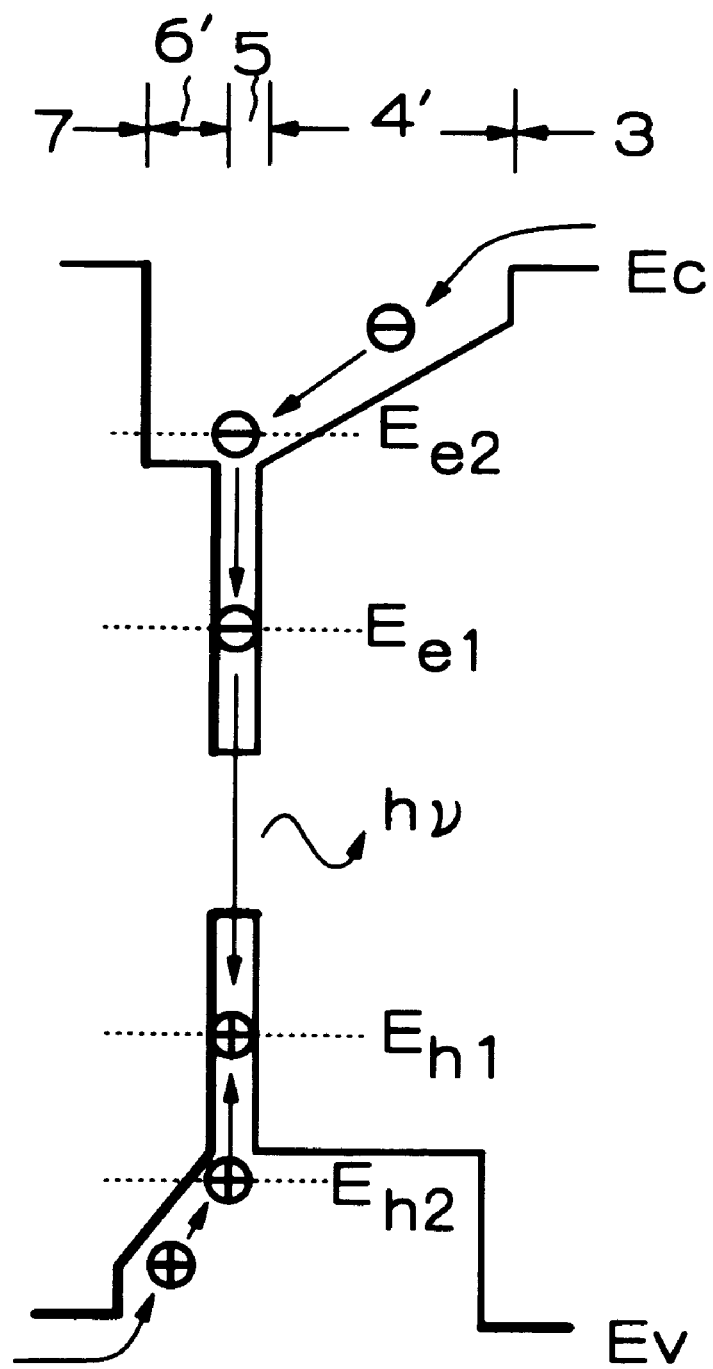
FIG. 12 is an energy band diagram for explaining the running speed of electrons and holes in the GRIN-SCH layers of FIG. 9.

Thus, in the semiconductor laser device of FIG. 9, as shown in FIG. 12, since the running speed of holes becomes larger as in the semiconductor laser device of FIG. 5, a time of electrons running through the GRIN-SCH layer 4' to the MQW active layer 5 is further brought close to a time of holes running through the GRIN-SCH layer 6' to the MQW active layer 5. Note that the second energy level $E_{h^2}$ of holes becomes lower simultaneously with the lowering of the second energy level $E_{e^2}$ of electrons, thus decreasing the above-mentioned time of holes. Therefore, the injection efficiency of electrons into the MQW active layer 5 is further brought close to the injection efficiency of holes into the MQW active layer 5, As a result, it is possible to obtain good modulation characteristics at high speed (high frequencies).

According to the inventor's experiment, when the semiconductor laser device of FIG. 9 is constructed as a resonator whose length is 300 μm, a front surface is 30-percent-coated, and a back surface is 90-percent-coated, the cut-off frequency at an output power of 10 mW is 11.5 GHz at a temperature of 20° C. and 8.5 GHz at a temperature of 85° C.

Figure 13:
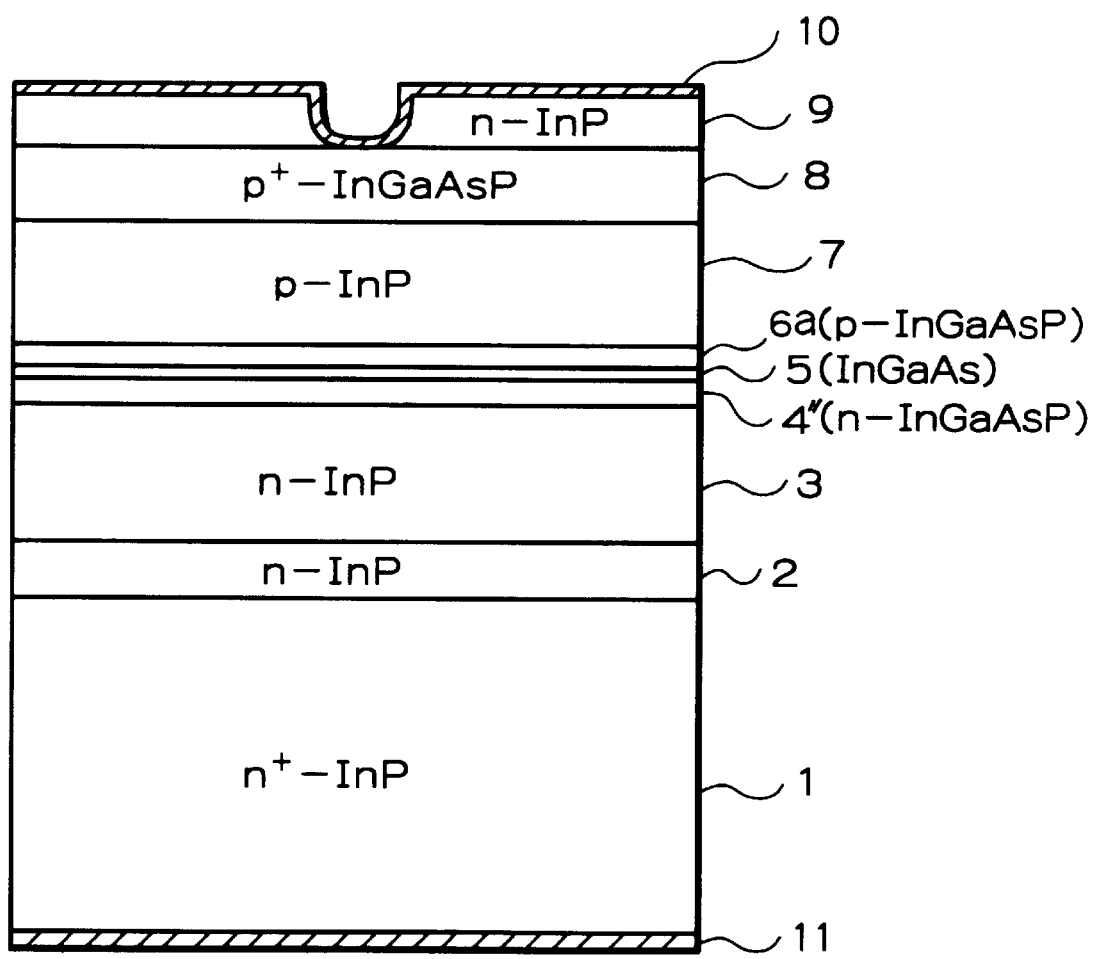
FIG. 13 is a cross-sectional view illustrating a third embodiment of the semiconductor laser device according to the present invention.

In FIG. 13, which illustrates a third embodiment of the present invention, the InGaAsP GRIN-SCH layer 4 of FIG. 5 is modified to an n-type InGaAsP GRIN-SCH layer 4".

Figure 14:
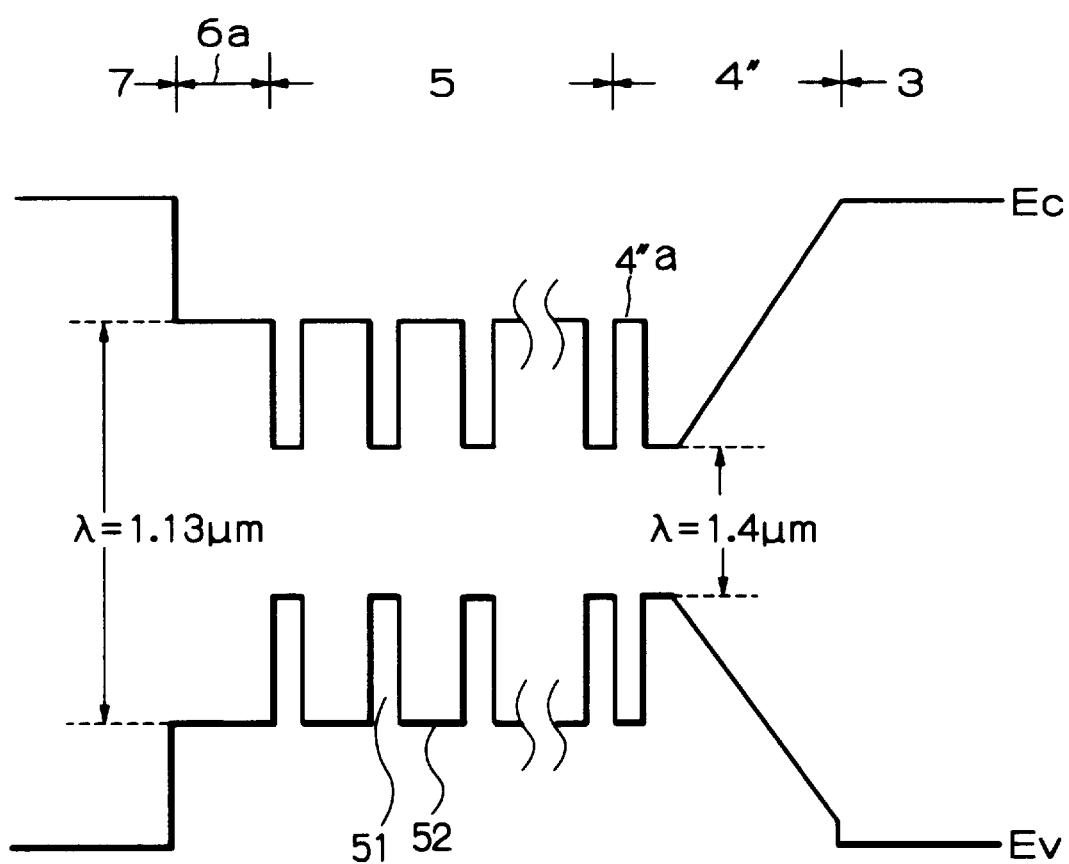
FIGS. 14 and 15 are energy gap diagrams of the MQW active layer and its neighborhood of FIG. 13.

In FIG. 14, which shows an energy band diagram of the distortion MQW active layer 5 and its neighborhood of FIG. 13, the energy gaps of the GRIN-SCH layers 4" and 6a are both larger than the energy gap of the barrier layers 52 of the distortion MQW active layer 5. Also, the GRIN-SCH layer 4" is thicker than the GRIN-SCH layer 6a.

The GRIN-SCH layer 4" has a tunnel barrier layer 4" capable of electron injection by the tunnel effect. Also, the GRIN-SCH layer 4" has an energy gap which is linearly larger, as it becomes more remote from the distortion MQW active layer 5, and has a thickness of 40 nm. In this case, the composition of the GRIN-SCH layer 4' is gradually changed from InGaAsP to InP at the interface between the layers 3 and 4", so that the conduction energy edge $E_c$ is changed and the valence energy edge $E_v$ is changed.

Figure 15:
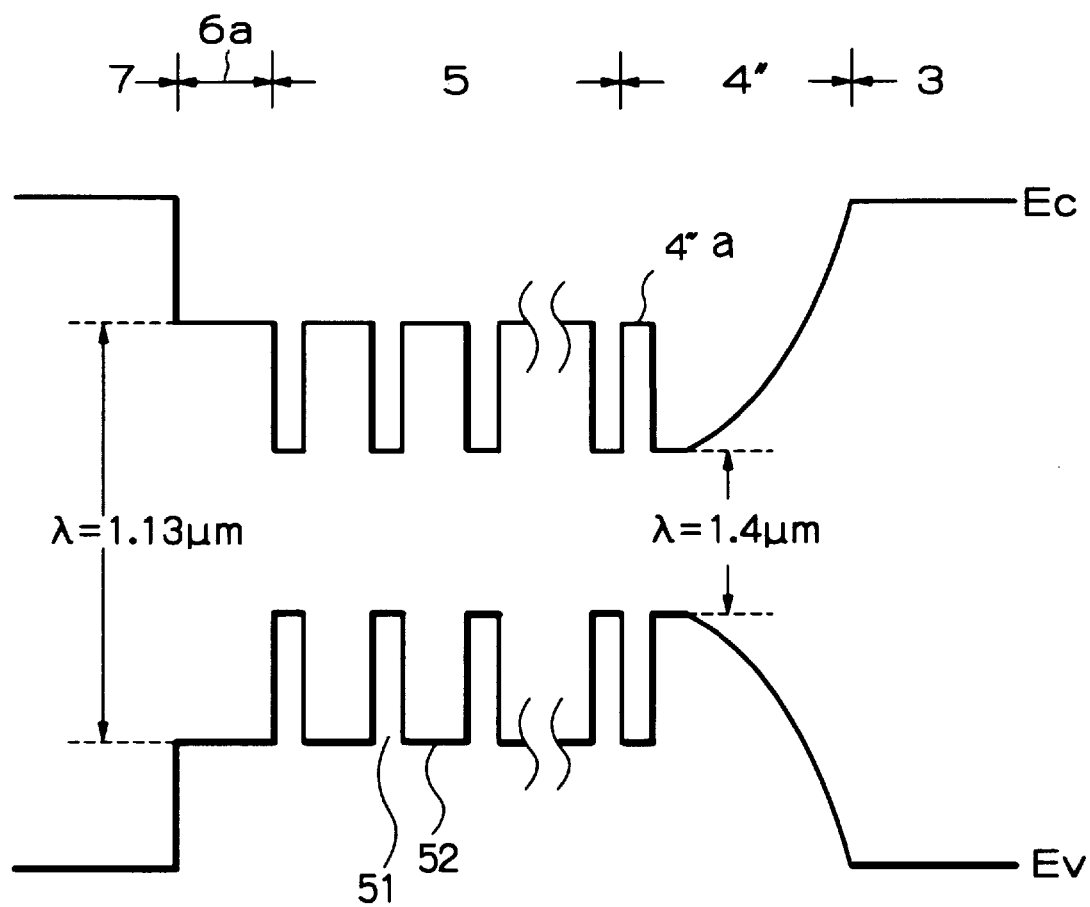

Note that the conduction energy edge $E_c$ of the GRIN-SCH layer 4" of FIG. 14 can be curvilinear as shown in FIG. 15.

Figure 16:
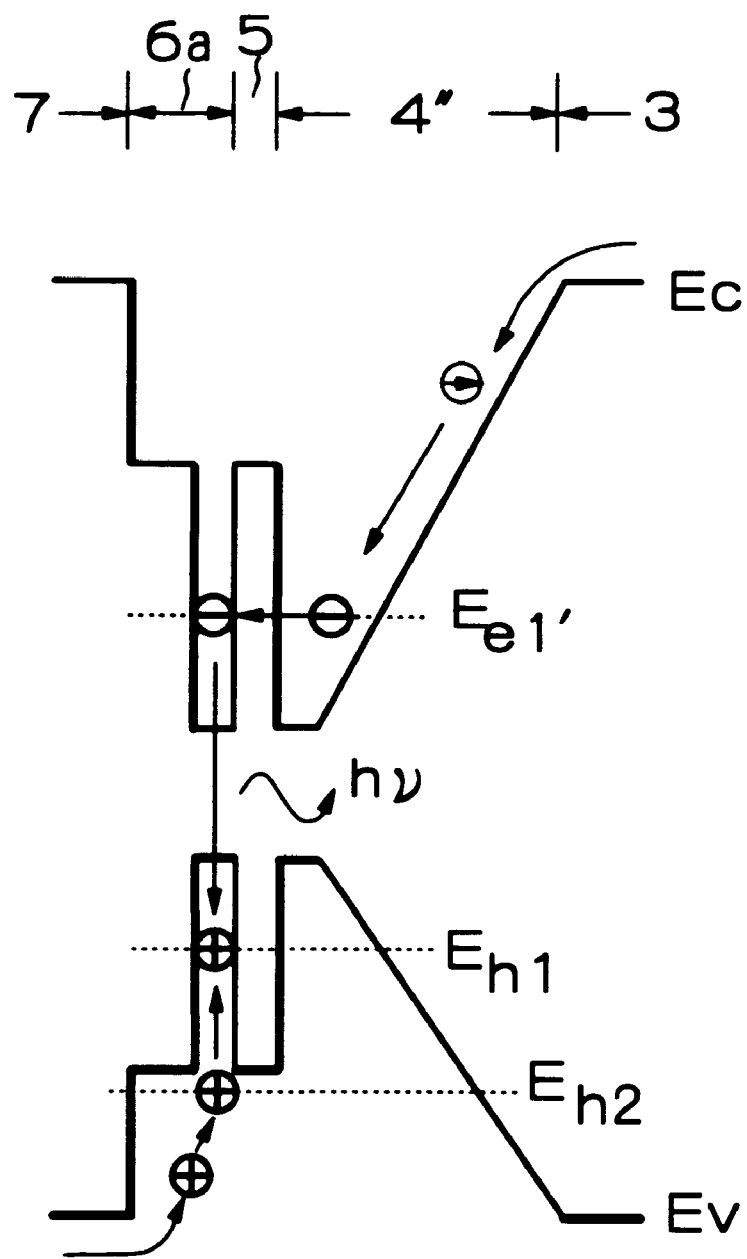
FIG. 16 is an energy band diagram for explaining the running speed of electrons and holes in the GRIN-SCH layer and the SCH layer of FIG. 13.

As shown in FIG. 16, in order to carry out the resonant tunnel injection of electrons, the first energy level $E_{e^1}$ of the right most side well layer of the distortion MQW active layer 5 coincides with the first energy level $E'_{e^1}$ of the GRIN-SCH layer 4". In the semiconductor laser device of FIG. 13, the injection efficiency of electrons into the distortion MQW active layer 5 can be enhanced. In addition, overflowing of carriers can be suppressed.

The present invention can be applied to other heterostructure III–V group semiconductor laser devices such as AlGaAs/GaAs laser devices and GaAlSb/GaSb laser devices.

As explained hereinabove, according to the present invention, since the injection efficiency of electrons and holes into the MQW active layer can be improved and the absorption of free carriers can be suppressed, the modulation width and the temperature characteristics can be improved, thus realizing high response characteristics irrespective of the temperature.

I claim:

1. A semiconductor laser device comprising;
   a multiple quantum well active layer including well layers and barrier layers alternately;
   an n-type separate confinement heterostructure layer formed on a first surface of said multiple quantum well active layer, an energy gap of said n-type separate confinement heterostructure layer being larger than an energy gap of said barrier layers; and
   a p-type separate confinement heterostructure layer formed on a second surface of said multiple quantum well active layer, an energy gap of said p-type separate confinement heterostructure layer being not smaller than an energy gap of said barrier layers,
   said n-type separate confinement heterostructure layer and said p-type separate confinement heterostructure layer each having a respective thickness selected so that a transit time of electrons moving through the n-type separate confinement heterostructure layer is brought close to a transit time of holes moving through said p-type separate confinement heterostructure layer.

2. The device as set forth in claim 1, where in the energy gap of said n-type separate confinement heterostructure layer is larger as it becomes more remote from said multiple quantum well active layer.

3. The device as set forth in claim 1, wherein a conduction band edge of said n-type separate confinement heterostructure layer is higher as it becomes more remote from said multiple quantum well active layer,
   a valence band edge of said p-type separate confinement heterostructure layer is lower as it becomes more remote from said multiple quantum well active layer.

4. The device as set forth in claim 1, wherein a composition of III group material of said n-type separate confinement layer is changed, so that a conduction band edge of said n-type separate confinement layer is higher as it becomes more remote from said multiple quantum well active layer.

5. A semiconductor laser device comprising:
   a multiple quantum well active layer including well layers and barrier layers alternately;
   an n-type separate confinement heterostructure layer formed on a first surface of said multiple quantum well active layer; and
   a p-type separate confinement heterostructure layer formed on a second surface of said multiple quantum well active layer, an energy gap of said p-type separate confinement heterostructure layer being larger than an energy gap of said barrier layers, said n-type separate confinement heterostructure layer and said p-type separate confinement heterostructure layer each having a respective thickness selected so that a transit time of electrons moving through the n-type separate confinement heterostructure layer is brought close to a transit time of holes moving through said p-type separate confinement heterostructure layer, said n-type separate confinement heterostructure layer including a tunnel barrier layer capable of passing electrons therethrough by the tunnel effect to said adjacent multiple quantum active layer, a conduction band edge of said n-type separate confinement heterostructure layer outside of said tunnel barrier layer being lower than a conduction band edge of said tunnel barrier layer.

6. The device as set forth in claim 5, wherein a first energy level of electrons of said n-type separate confinement heterostructure layer is brought close to a first energy level of electrons of the nearest one of said well layers of said multiple quantum well active layer to said n-type separate confinement heterostructure layer.

7. A semiconductor laser device comprising:

a multiple quantum well active layer including well layers and barrier layers alternately; and an n-type separate confinement heterostructure layer and a p-type separate confinement heterostructure layer sandwiching said multiple quantum well active layer, said n-type separate confinement heterostructure layer and said p-type separate confinement heterostructure layer each having a respective thickness selected so that a transit time of electrons moving through the n-type separate confinement heterostructure layer is brought close to a transit time of holes moving through said p-type separate confinement heterostructure layer, an energy gap of said n-type separate confinement heterostructure layer being larger than an energy gap of said barrier layers and being larger as it becomes more remote from said multiple quantum well active layer, an energy gap of said p-type separate confinement heterostructure layer being definite and not smaller than an energy gap of said barrier layers.

8. The device as set forth in claim 7, further comprising:

an-n-type clad layer formed on said n-type separate confinement heterostructure layer having an energy gap larger than that of said n-type separate confinement heterostructure layer; and a p-type clad layer formed on said p-type separate confinement heterostructure layer having an energy gap larger than that of said p-type separate confinement heterostructure layer.

9. A semiconductor laser device comprising:

a multiple quantum well active layer including well layers and barrier layers alternately; and an n-type separate confinement heterostructure layer and a p-type separate confinement heterostructure layer sandwiching said multiple quantum well active layer, said n-type separate confinement heterostructure layer and said p-type separate confinement heterostructure layer each having a respective thickness selected so that a transit time of electrons moving through the n-type separate confinement heterostructure layer is brought close to a transit time of holes moving through said p-type separate confinement heterostructure layer, an energy gap of said n-type separate confinement heterostructure layer being larger than an energy gap of said barrier layers, a conduction band edge of said n-type separate confinement heterostructure layer being higher as it becomes more remote from said multiple quantum well active layer, an energy gap of said p-type separate confinement heterostructure layer being larger than an energy gap of said barrier layers, a valence band edge of said p-type separate confinement heterostructure layer being lower as it becomes more remote from said multiple quantum well active layer.

10. The device as set forth in claim 9, further comprising:

an-n-type clad layer formed on said type n-type separate confinement heterostructure layer having an energy gap larger than that of said n-type separate confinement heterostructure layer; and a p-type clad layer formed on said p-type separate confinement heterostructure layer having an energy gap larger than that of said p-type separate confinement heterostructure layer.

11. A semiconductor laser device comprising:

a multiple quantum well active layer including well layers and barrier layer alternately; and an n-type separate confinement heterostructure layer and a p-type separate confinement heterostructure layer sandwiching said multiple quantum well active layer, said n-type separate confinement heterostructure layer and said p-type separate confinement heterostructure layer each having a respective thickness selected so that a transit time of electrons moving through the n-type separate confinement heterostructure layer is brought close to a transit time of holes moving through said p-type separate confinement heterostructure layer, said n-type separate confinement heterostructure layer including a tunnel barrier layer capable of passing electrons therethrough by the tunnel effect to said adjacent multiple quantum active layer, a conduction band edge of said n-type separate confinement heterostructure layer outside of said tunnel barrier layer being lower than a conduction band edge of said tunnel barrier layer, an energy gap of said n-type separate confinement heterostructure layer being larger than an energy gap of said well layers and being larger as it becomes more remote from said multiple quantum well active layer, an energy gap of said p-type separate confinement heterostructure layer being definite and not smaller than an energy gap of said barrier layers.

12. The device as set forth in claim 11, wherein a first energy level of electrons of said n-type separate confinement heterostructure layer is brought close to a first energy level of electrons of the nearest one of said well layers of said multiple quantum well active layer to said n-type separate confinement heterostructure layer.

13. The device as set forth in claim 11, further comprising:

an n-type clad layer formed on said n-type separate confinement heterostructure layer having an energy gap larger than that of said n-type separate confinement heterostructure layer; and a p-type clad layer formed on said p-type separate confinement heterostructure layer having an energy gap larger than that of said p-type separate confinement heterostructure layer.

* * * * *

UNITED STATES PATENT AND TRADEMARK OFFICE
CERTIFICATE OF CORRECTION

PATENT NO.    : 6,078,602
DATED         : June 20, 2000
INVENTOR(S)   : Sato, Kenji Page 1 of 1

It is certified that error appears in the above-identified patent and that said Letters Patent is hereby corrected as shown below:

Foreign Application Priority Data,
Change "Feb. 12, 1996" to -- Dec. 2, 1996 --.

Column 3,
Line 2, after "Also," add -- an n-type InP buffer layer 2, --.
Line 9, replace "P-type" with -- p-type -- and "N-type" with -- n-type --.
Line 15, replace "or" with -- of --.

Column 4,
Line 52, delete "C. and" and insert -- C and --.
Line 55, delete "C." and insert -- C --.

Column 5,
Line 15, after "In this case, the" delete "In this case, the".
Line 18, delete "7'" and insert -- 7 --.
Line 42, delete "C." and insert -- C --.
Line 53, delete "layer 4'" and insert -- layer 4"a --.
Line 58, delete "4'" and insert -- 4 --.

Column 6,
Line 40, change "where in" to -- wherein --.

Column 8,
Line 13, change "an-n-type" to -- an n-type --.

Figures 6, 7, and 8,
Change "6" to -- 6a --.

Signed and Sealed this

Eleventh Day of September, 2001

Attest:

*Nicholas P. Godici*

NICHOLAS P. GODICI
*Attesting Officer*   *Acting Director of the United States Patent and Trademark Office*